United States Patent
Kobayashi

(10) Patent No.: US 9,306,062 B2
(45) Date of Patent: Apr. 5, 2016

(54) SEMICONDUCTOR DEVICE

(71) Applicant: SEIKO INSTRUMENTS INC., Chiba (JP)

(72) Inventor: Naoto Kobayashi, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 40 days.

(21) Appl. No.: 14/033,892

(22) Filed: Sep. 23, 2013

(65) Prior Publication Data

US 2014/0091387 A1    Apr. 3, 2014

(30) Foreign Application Priority Data

Sep. 28, 2012  (JP) ................... 2012-217985

(51) Int. Cl.
*H01L 29/78*    (2006.01)
*H01L 29/423*    (2006.01)

(52) U.S. Cl.
CPC ...... *H01L 29/7827* (2013.01); *H01L 29/42372* (2013.01); *H01L 29/7813* (2013.01)

(58) Field of Classification Search
CPC ............ H01L 29/7827; H01L 29/7813; H01L 29/42372; H01L 29/42356; H01L 29/4236; H01L 29/42376; H01L 29/4238
USPC ................................. 257/330, 331
See application file for complete search history.

(56) References Cited

U.S. PATENT DOCUMENTS

| | | | | |
|---|---|---|---|---|
| 6,031,265 A * | 2/2000 | Hshieh | ...................... | 257/334 |
| 2002/0009867 A1 * | 1/2002 | Numazawa | ....... | H01L 21/28185 438/589 |
| 2002/0017671 A1 * | 2/2002 | goebel et al. | ................. | 257/301 |
| 2002/0190313 A1 * | 12/2002 | Takaishi et al. | ............... | 257/330 |
| 2003/0047779 A1 * | 3/2003 | Peake et al. | .................... | 257/341 |
| 2003/0178673 A1 * | 9/2003 | Bhalla et al. | .................. | 257/330 |
| 2006/0226475 A1 * | 10/2006 | Yamamoto | .......... | H01L 29/0696 257/330 |
| 2006/0273385 A1 * | 12/2006 | Hshieh | .......................... | 257/330 |
| 2009/0057756 A1 * | 3/2009 | Hshieh | .......................... | 257/330 |
| 2009/0072304 A1 * | 3/2009 | Adan | .................. | H01L 29/0696 257/330 |
| 2009/0140330 A1 * | 6/2009 | Yagi et al. | ...................... | 257/330 |
| 2009/0200607 A1 * | 8/2009 | Matsuura | .......... | H01L 29/41741 257/332 |
| 2009/0242976 A1 * | 10/2009 | Hino | ............................. | 257/330 |
| 2011/0260212 A1 * | 10/2011 | Tsuzuki et al. | ............... | 257/139 |
| 2012/0012860 A1 * | 1/2012 | Miyahara et al. | ............... | 257/77 |
| 2012/0326207 A1 * | 12/2012 | Yoshimochi | .................. | 257/139 |

OTHER PUBLICATIONS

Patent Abstracts of Japan, Publication No. 2009-188294, Publication Date Aug. 20, 2009.

* cited by examiner

*Primary Examiner* — Khiem D Nguyen
*Assistant Examiner* — Pauline Vu
(74) *Attorney, Agent, or Firm* — Adams & Wilks

(57) ABSTRACT

A semiconductor device has a body layer disposed in a semiconductor substrate, cell regions arranged around a surface layer part of the body layer, and trenches arranged in a grid pattern for separating the cell regions from each other. A gate insulating film covers inner walls of the first trenches and an inner wall of the second trench, and a gate electrode is filled in the first trenches and the second trench covered by the gate insulating film. A cell circumferential region is disposed to surround an outer side of the second trench. An interlayer insulating film is disposed on the cell regions, the first trenches, and the second trench. A gate contact hole is disposed in the interlayer insulating film at an intersection of the first trenches arranged in the grid pattern. A gate wiring is connected to the gate electrode via the gate contact hole.

12 Claims, 6 Drawing Sheets

US 9,306,062 B2

SEMICONDUCTOR DEVICE

BACKGROUND OF THE INVENTION

1. Field of the Invention

The present invention relates to a semiconductor device, and more particularly, to a MOS semiconductor device having a trench gate structure.

2. Description of the Related Art

FIGS. 6 and 7 illustrate an exemplary conventional vertical MOSFET having a trench gate structure (hereinafter referred to as "trench MOSFET"). FIG. 6 is a schematic plan view of the trench MOSFET and its circumference. FIG. 7 is a schematic cross-sectional view taken along the line C-C' of FIG. 6.

As illustrated in FIGS. 6 and 7, a P-type well layer 2 and a P-type body layer 3 are formed in a surface layer part of a semiconductor substrate 1 in a cell circumferential region 16 and a cell region 15, respectively, and an N-type source region 9 is formed in a surface layer part of the P-type body layer 3. A trench 4 is formed at such a depth that the trench 4 passes through the source region 9 and the body layer 3. On an inner wall of the trench 4, a gate insulating film 5 such as silicon dioxide and a gate electrode 6 such as polysilicon are formed in this order, to thereby constitute a trench gate. At the outermost circumference of the trench gate, a gate lead wiring 7 such as polysilicon is formed from a region on the gate electrode 6 to a region on a field insulating film 13 such as silicon dioxide formed in a surface layer part of the P-type well layer 2, and the gate lead wiring 7 is electrically connected to the gate electrode 6. In this case, the width of the trench 4 at the outermost circumference is larger than the width of other trenches in order to electrically connect the gate electrode 6 and the gate lead wiring 7 to each other. The gate lead wiring 7 is further electrically connected to a gate wiring 10 such as aluminum via a gate contact hole 8 that is provided above the field insulating film 13 so as to pass through an interlayer insulating film 14 formed on the gate lead wiring 7. In the vicinity of the cell region 15, the interlayer insulating film 14 is formed so as to cover on the trench gate, and a source wiring 11 such as aluminum is formed thereon so that the source region 9 and the source wiring 11 are electrically connected to each other. A drain electrode 12 is formed on a rear surface of the substrate 1, thereby forming a vertical element structure.

As illustrated in FIGS. 6 and 7, Japanese Patent Application Laid-open No. 2009-188294 discloses the structure in which the outermost circumferential trench gate of the trench MOSFET is formed into an annular shape, and the gate lead wiring 7 is formed to extend toward the cell circumferential region 16 so that one end thereof is connected to the electrode 6 in an overlapping manner, thereby decreasing the gate resistance.

In FIG. 7, however, the gate lead wiring 7 is formed also on a corner made up of a side surface of the trench 4 and a front surface of the substrate 1. In the case where the gate insulating film 5 is formed by thermal oxidation of silicon, because the gate insulating film 5 is liable to be thin at the corner, there is a problem of an increased gate leakage current between the gate electrode 6 and the P-type well layer 2 or a decreased gate breakdown voltage.

SUMMARY OF THE INVENTION

The present invention has been made in view of the above-mentioned circumstances, and has an object to provide a MOS semiconductor device having a trench gate structure.

In order to solve the above-mentioned problem, a semiconductor device according to one embodiment of the present invention includes: a transistor having a trench gate, the transistor including: a trench formed in a surface of a semiconductor substrate; a first insulating film provided on an inner wall surface of the trench; and a first conductive layer that fills the trench via the first insulating film; a second insulating film formed on the transistor; a gate contact hole formed by removing a part of the second insulating film; and a second conductive layer formed inside the gate contact hole and on a part of the second insulating film, the gate contact hole being formed on the trench.

Further, a semiconductor device according to another embodiment of the present invention includes a transistor in which the trench gate is formed in a grid pattern and a plurality of source regions are surrounded by the trench gate, and the gate contact hole is formed at an intersection portion of the trench gate.

Alternatively, a semiconductor device according to still another embodiment of the present invention includes a transistor in which the trench gate is formed in a randomly zigzag shape and a plurality of source regions are surrounded by the trench gate, and the gate contact hole is formed at an intersection portion of the trench gate.

According to one embodiment of the present invention, the MOS semiconductor device having the trench gate structure, which is excellent in reliability of the gate oxidation film and low in gate resistance can be provided.

DETAILED DESCRIPTION OF THE PREFERRED EMBODIMENTS

Now, a semiconductor device according to the present invention is described in detail below by way of embodiments with reference to the accompanying drawings.

First Embodiment

Figure 1:
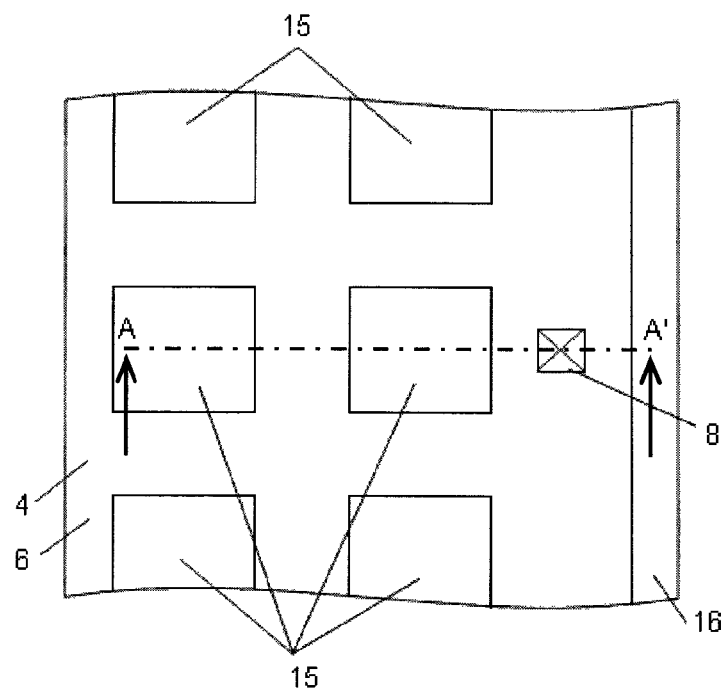
FIG. 1 is a partial plan view of a trench MOSFET according to a first embodiment of the present invention.
Figure 2:
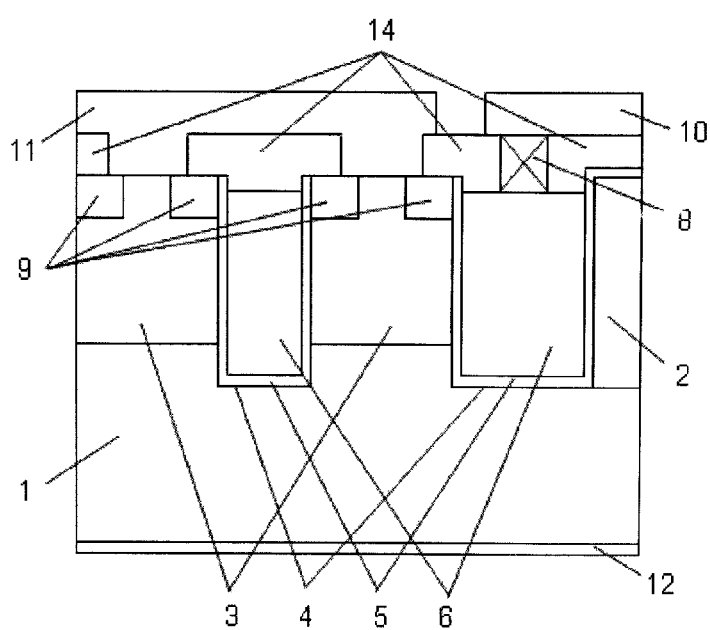
FIG. 2 is a schematic cross-sectional view taken along the line A-A' of FIG. 1.

FIG. 1 is a partial plan view of a semiconductor device including a trench MOSFET according to a first embodiment of the present invention. FIG. 2 is a schematic cross-sectional view taken along the line A-A' of FIG. 1.

As illustrated in FIGS. 1 and 2, in a surface layer part of a semiconductor substrate 1, a P-type well layer 2 and a P-type body layer 3 are formed respectively in a cell circumferential region 16 and in a plurality of cell regions 15 arranged vertically and horizontally. An N-type source region 9 is formed around a surface layer part of the P-type body layer 3 in the plurality of cell regions 15. The cell circumferential region 16 surrounds the outer sides of the arranged plurality of cell regions. Between two opposed cell regions, a trench 4 is formed at such a depth that the trench 4 passes through the source region 9 and the body layer 3. A gate insulating film 5 such as silicon dioxide for covering an inner wall of the trench 4 and a gate electrode 6 such as polysilicon for filling the trench having the gate insulating film 5 formed thereon are formed in this order, to thereby constitute a trench gate. The gate electrode 6 is electrically connected to a gate wiring 10 such as aluminum via a gate contact hole 8 that is formed on the outermost circumferential gate electrode 6 so as to pass through an interlayer insulating film 14 formed on the substrate. The widths of the trenches 4 provided between the plurality of cell regions 15 to separate the respective cell regions are constant in order that the current may flow uniformly. On the other hand, in order that the gate contact hole 8 may be prevented from being connected to the source region 9 or the P-type well layer 2, the width of a trench at the outermost circumference among the trenches 4 is larger than the width of the gate contact hole 8, and hence this trench is a wide trench. Further, the width of the trench is larger than the width of the trench 4 provided between the cell regions 15. The above-mentioned cell circumferential region 16 is provided outside the outermost circumferential trench. In the cell region 15 and the vicinity of the cell region 15, the interlayer insulating film 14 is formed so as to cover on the trench gate, and a source wiring 11 such as aluminum is formed thereon so that the source region 9 and the source wiring 11 are electrically connected to each other. A drain electrode 12 is formed on a rear surface of the substrate 1, thereby forming a vertical element structure.

As illustrated in FIGS. 1 and 2, because the gate contact hole 8 is formed on the gate electrode 6, the resistance of a gate lead wiring can be eliminated to decrease the gate resistance. Besides, because the gate lead wiring is not used, even when the thickness of the gate insulating film 5 becomes thinner at an upper corner of the trench 4, neither increase in gate leakage current nor decrease in gate breakdown voltage occurs.

Second Embodiment

In a second embodiment of the present invention, only a different part from the first embodiment is described below. As opposed to the first embodiment in which the gate contact hole 8 is formed on the outermost circumferential gate electrode 6, the feature of the second embodiment resides in that the gate contact hole 8 is formed at an intersection of the trenches 4 formed in a grid pattern.

Figure 3A:
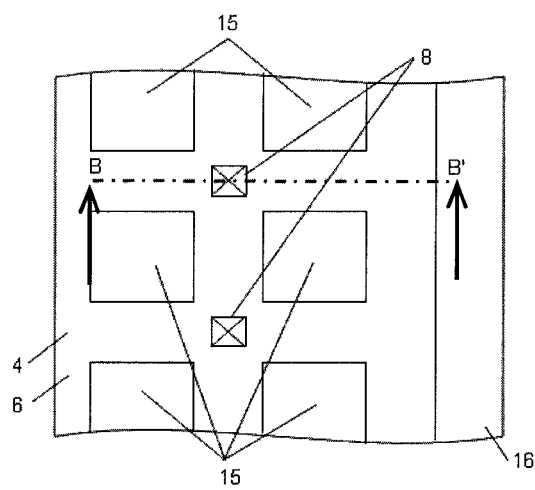
FIGS. 3A to 3D are partial plan views of a trench MOSFET according to a second embodiment of the present invention.
Figure 4:
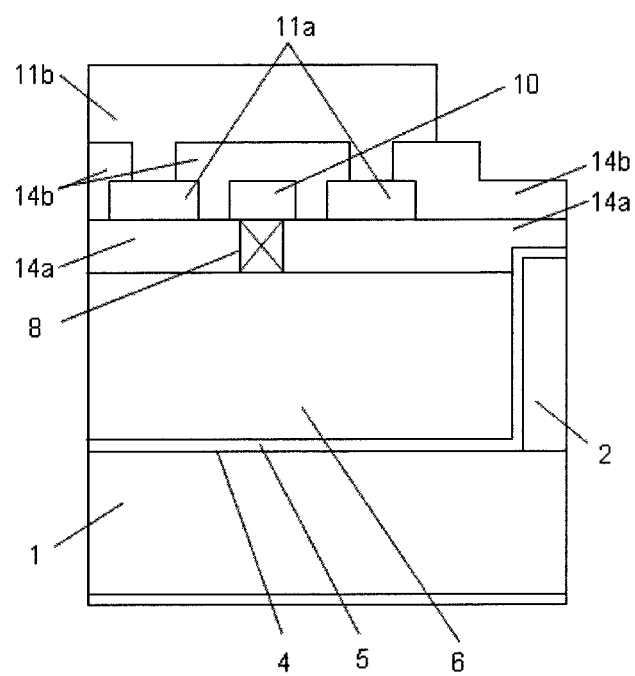
FIG. 4 is a schematic cross-sectional view taken along the line B-B' of FIG. 3A.

FIG. 3A is a partial plan view of a semiconductor device according to this embodiment. FIG. 4 is a schematic cross-sectional view taken along the line B-B' of FIG. 3A. As illustrated in the figures, the gate contact hole 8 is formed at an intersection of the trenches 4 formed in a grid pattern, and the gate contact hole 8 is not provided on a trench at the outermost circumference among the trenches 4. Accordingly, the width of the trench at the outermost circumference among the trenches 4 is equal to the width of trenches located in other regions.

Because the distance between the cell regions 15 is √2 times as large as the width of the trench 4 at the intersection of the trenches 4 formed in a grid pattern, the distance between the contact hole 8 and the cell region 15 can be increased without increasing the width of the trench 4. Further, because the contact hole 8 is formed close to the cell region 15, the gate resistance can be decreased as compared with the case where the contact hole 8 is formed at the circumference. In addition, by avoiding the gate contact hole 8 from being arranged on the outermost circumferential gate electrode 6, the width of the outermost circumferential trench 4 can be freely set.

In this embodiment, because the gate wiring 10 needs to be formed so as to be sandwiched by source wirings 11a, the wiring such as aluminum is formed into a double layer. Specifically, a second interlayer insulating film 14b is formed so as to cover the gate wiring 10, and a source wiring 11b such as aluminum is formed thereon so that the source wirings 11a and 11b are electrically connected to each other.

A so-called discrete semiconductor device, including only a trench MOSFET and a diode for protecting a gate insulating film thereof, is desired to have a single-layer wiring such as aluminum in view of manufacturing cost. However, in a semiconductor integrated circuit device in which a lateral complementary MOSFET and a trench MOSFET are integrated on a single substrate, because a double or more wiring is often required in a complementary MOSFET portion, this embodiment is effective in a semiconductor integrated circuit device in terms of manufacturing cost.

Figure 3B:
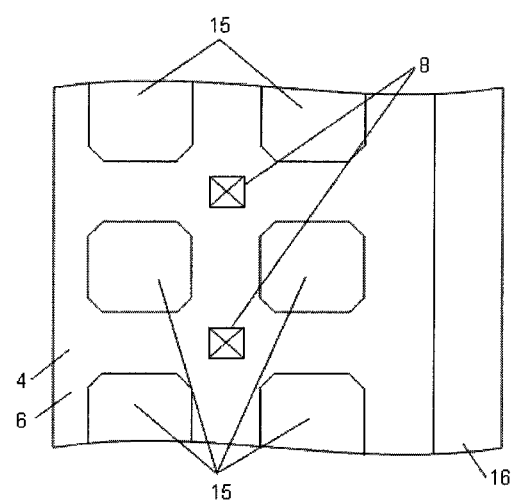
Figure 3C:
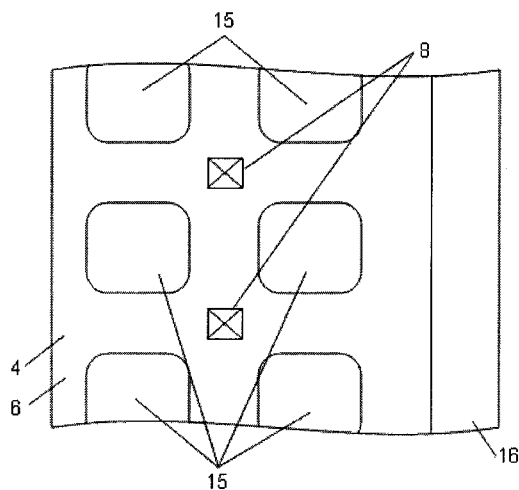
Figure 3D:
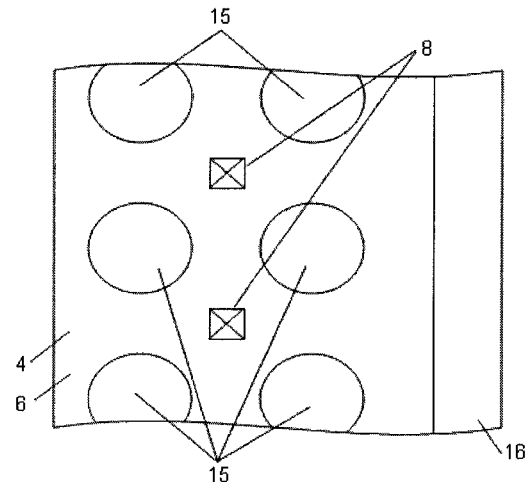

FIGS. 3B, 3C, and 3D are modified examples of the second embodiment, in which the cell regions 15 are octagonal, rounded rectangular, and circular in plan, respectively. As illustrated in the figures, when the corners of the cell region 15 are rounded, the distance between the cell regions 15 at the intersection of the trenches 4 is increased. Consequently, for example, even when the width of the trench 4 and the width of the gate contact hole 8 are the same, the gate contact hole 8 can be formed on the gate electrode 6 without increasing the width of the trench 4.

Other Modified Examples

Figure 5A:
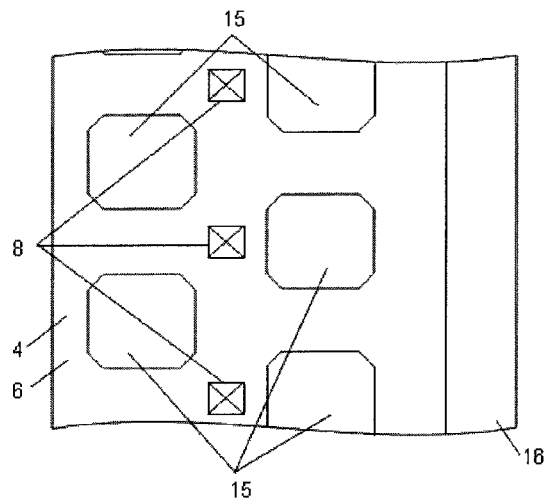
FIGS. 5A to 5C are partial plan views of trench MOSFETs according to other embodiments of the present invention.
Figure 5B:
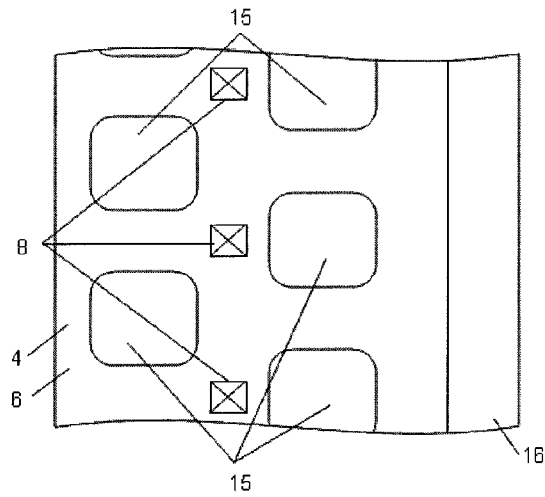
Figure 5C:
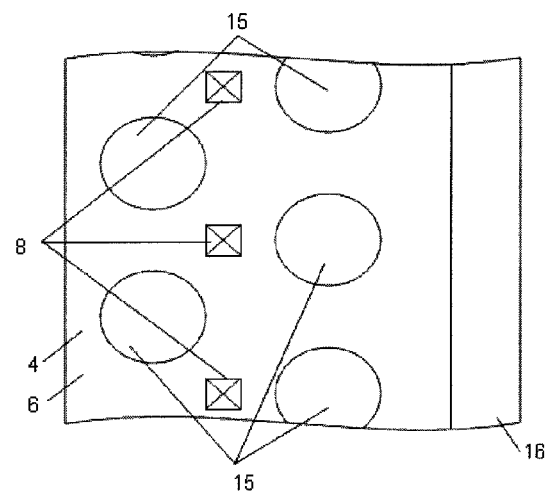
Figure 6:
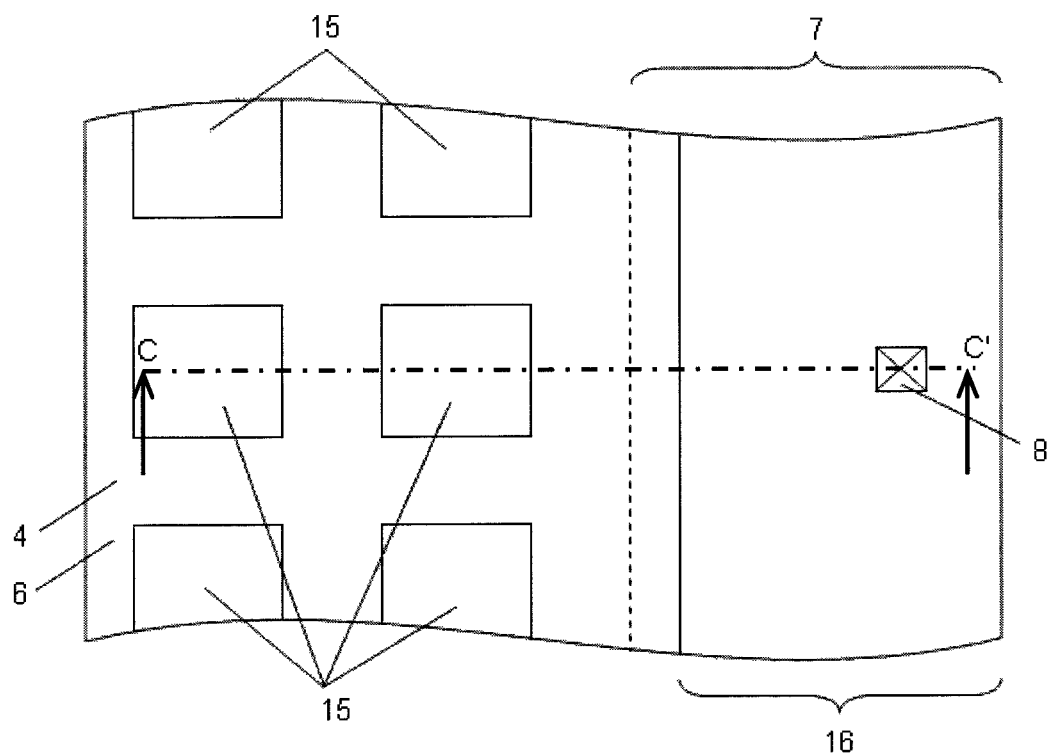
FIG. 6 is a partial plan view of a conventional trench MOSFET.
Figure 7:
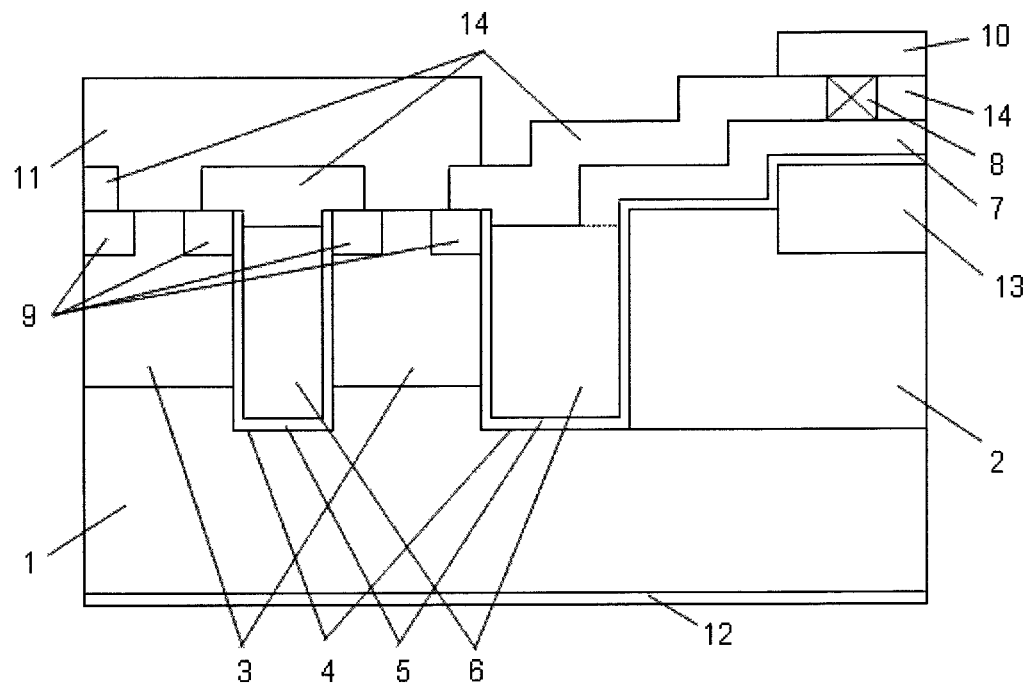
FIG. 7 is a schematic cross-sectional view taken along the line C-C' of the conventional trench MOSFET of FIG. 6.

In the second embodiment, the trenches 4 are arranged in a square grid pattern. Alternatively, however, as illustrated in FIGS. 5A, 5B, and 5C, the cell regions 15 may be arranged in a zigzag manner, and the trenches 4 may be formed in a grid pattern in an alternately zigzag manner (zigzag grid pattern). As compared with the trenches 4 formed in a grid pattern, the distance between the cell regions 15 at the intersection of the trenches 4 is reduced, but the effects similar to those in the case where the trenches 4 are formed in a grid pattern can be obtained.

Although the corners of the cell regions 15 are all rounded in FIGS. 3B and 3C, it is only necessary that the cell region 15 have rounded corners, which is adjacent to the intersection of the trenches 4 at which the gate contact hole 8 is formed.

What has been described above is merely one embodiment of the present invention, and it should be understood that other various modified embodiments are possible without departing from the gist of the present invention.

What is claimed is:
1. A semiconductor device, comprising:
a semiconductor substrate;
a body layer disposed in the semiconductor substrate;
a plurality of cell regions, each comprising a source region arranged around a surface layer part of the body layer;
first trenches arranged in a grid pattern and having a constant width, for separating the plurality of cell regions from each other;
a second trench disposed at an outermost circumference of the plurality of cell regions;
a gate insulating film for covering inner walls of the first trenches and an inner wall of the second trench;
a gate electrode that fills the first trenches and the second trench covered by the gate insulating film;

a cell circumferential region disposed to surround an outer side of the second trench;

an interlayer insulating film disposed on the plurality of cell regions, the first trenches, and the second trench;

a gate contact hole disposed in the interlayer insulating film at an intersection of the first trenches arranged in the grid pattern, the gate contact hole not being provided on the second trench; and a gate wiring connected to the gate electrode via the gate contact hole.

2. A semiconductor device, comprising:

a semiconductor substrate;

a body layer disposed in the semiconductor substrate;

a plurality of cell regions, each comprising a source region arranged around a surface layer part of the body layer;

first trenches arranged in a zigzag grid pattern and having a constant width, for separating the plurality of cell regions from each other;

a second trench disposed at an outermost circumference of the plurality of cell regions;

a gate insulating film for covering inner walls of the first trenches and an inner wall of the second trench;

a gate electrode that fills the first trenches and the second trench covered by the gate insulating film;

a cell circumferential region disposed to surround an outer side of the second trench;

an interlayer insulating film disposed on the plurality of cell regions, the first trenches, and the second trench;

a gate contact hole disposed in the interlayer insulating film at an intersection of the first trenches arranged in the zigzag grid pattern, the gate contact hole not being provided on the second trench; and a gate wiring connected to the gate electrode via the gate contact hole.

3. A semiconductor device according to claim 1, wherein each of the plurality of cell regions has rounded corners.

4. A semiconductor device according to claim 1, wherein the gate contact hole is formed on the gate electrode so as to pass through the interlayer insulating film.

5. A semiconductor device according to claim 2, wherein each of the plurality of cell regions has rounded corners.

6. A semiconductor device according to claim 2, wherein the gate contact hole is formed on the gate electrode so as to pass through the interlayer insulating film.

7. A semiconductor device, comprising:

a semiconductor substrate;

a plurality of cell regions formed on the semiconductor substrate;

first trenches arranged in a grid pattern so as to separate the plurality of cell regions from each other;

a second trench disposed at an outermost circumference of the plurality of cell regions;

a gate insulating film covering inner walls of the first trenches and an inner wall of the second trench;

a gate electrode filled the first trenches and the second trench covered by the gate insulating film;

an interlayer insulating film disposed on the plurality of cell regions, the first trenches, and the second trench;

a gate contact hole disposed in the interlayer insulating film at an intersection of the first trenches arranged in the grid pattern, the gate contact hole not being provided on the second trench; and a gate wiring connected to the gate electrode via the gate contact hole.

8. A semiconductor device according to claim 7, wherein the grid pattern comprises a zigzag grid pattern.

9. A semiconductor device according to claim 8, wherein each of the plurality of cell regions has rounded corners.

10. A semiconductor device according to claim 8, wherein the gate contact hole is formed on the gate electrode so as to pass through the interlayer insulating film.

11. A semiconductor device according to claim 7, wherein each of the plurality of cell regions has rounded corners.

12. A semiconductor device according to claim 7, wherein the gate contact hole is formed on the gate electrode so as to pass through the interlayer insulating film.

* * * * *